(12) United States Patent
Ando et al.

(10) Patent No.: US 10,916,699 B2
(45) Date of Patent: Feb. 9, 2021

(54) RESISTIVE MEMORY CROSSBAR ARRAY EMPLOYING SELECTIVE BARRIER LAYER GROWTH

(71) Applicant: INTERNATIONAL BUSINESS MACHINES CORPORATION, Armonk, NY (US)

(72) Inventors: Takashi Ando, Tuckahoe, NY (US); Chih-Chao Yang, Glenmont, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/671,425

(22) Filed: Nov. 1, 2019

(65) Prior Publication Data

US 2020/0066983 A1 Feb. 27, 2020

Related U.S. Application Data

(62) Division of application No. 16/037,488, filed on Jul. 17, 2018, now Pat. No. 10,475,997.

(51) Int. Cl.
*H01L 45/00* (2006.01)
*H01L 27/24* (2006.01)
(Continued)

(52) U.S. Cl.
CPC ...... *H01L 45/1233* (2013.01); *G11C 13/0002* (2013.01); *H01L 21/76829* (2013.01); *H01L 23/5329* (2013.01); *H01L 27/2463* (2013.01); *H01L 27/2481* (2013.01); *H01L 45/085* (2013.01); *H01L 45/1253* (2013.01);
(Continued)

(58) Field of Classification Search
CPC ......... H01L 43/08; H01L 43/10; H01L 43/02; H01L 45/06; H01L 45/146; H01L 45/1233; H01L 45/1253; H01L 21/76829; H01L 23/5329; H01L 27/2463; H01L 27/2481; H01L 45/085; H01L 45/147; H01L 45/1608; H01L 45/1675; G11C 11/0002

See application file for complete search history.

(56) References Cited

U.S. PATENT DOCUMENTS 9,147,836 B2 9/2015 Greene et al.
9,318,533 B2 4/2016 Kalra et al.
(Continued)

OTHER PUBLICATIONS

List of IBM Patents or Patent Applications Treated as Related dated Nov. 1, 2019, 2 pages.
(Continued)

*Primary Examiner* — Michael Jung
(74) *Attorney, Agent, or Firm* — Tutunjian & Bitetto, P. C.; Randall Bluestone

(57) ABSTRACT

A method is presented for protecting resistive random access memory (RRAM) stacks within a resistive memory crossbar array. The method includes forming a plurality of conductive lines within an interlayer dielectric (ILD), forming a barrier layer over at least one conductive line of the plurality of conductive lines, the barrier layer directly contacting an entire upper surface of the at least one conductive line, and forming a RRAM stack including a bottom electrode, a high-k dielectric layer, and a top electrode over the barrier layer.

20 Claims, 6 Drawing Sheets

(51) Int. Cl.
*H01L 21/768* (2006.01)
*G11C 13/00* (2006.01)
*H01L 23/532* (2006.01)

(52) U.S. Cl.
CPC .......... *H01L 45/146* (2013.01); *H01L 45/147* (2013.01); *H01L 45/1608* (2013.01); *H01L 45/1675* (2013.01); *G11C 2213/51* (2013.01); *H01L 45/08* (2013.01)

(56) References Cited

U.S. PATENT DOCUMENTS

| | | |
|---|---|---|
| 9,515,262 B2 | 12/2016 | Wang et al. |
| 9,601,546 B1 | 3/2017 | Ando et al. |
| 9,853,091 B2 | 12/2017 | Chou et al. |
| 2015/0137059 A1 | 5/2015 | Chen et al. |
| 2015/0263279 A1* | 9/2015 | Hayakawa .......... H01L 27/2436 257/4 |
| 2016/0155933 A1* | 6/2016 | Kim ...................... G06F 3/0655 711/104 |
| 2018/0166501 A1* | 6/2018 | Chuang .................. H01L 43/08 |
| 2019/0229264 A1* | 7/2019 | Karpov ................ H01L 45/144 |
| 2020/0144496 A1* | 5/2020 | Glassman ............... H01L 45/08 |

OTHER PUBLICATIONS

Wong et al., "Metal-Oxide RRAM", Proceedings of the IEEE. vol. 10, Issue 6. May 2, 2012. pp. 1951-1970.

\* cited by examiner

RESISTIVE MEMORY CROSSBAR ARRAY EMPLOYING SELECTIVE BARRIER LAYER GROWTH

BACKGROUND

Technical Field

The present invention relates generally to semiconductor devices, and more specifically, to a resistive memory crossbar array employing selective barrier layer growth.

Description of the Related Art

Resistive random access memory (RRAM) is considered a promising technology for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing the connection weight in the form of device resistance. Multiple pre-neurons and post-neurons can be connected through a crossbar array of RRAMs, which can express a fully-connected neural network configuration.

SUMMARY

In accordance with an embodiment, a method is provided for protecting resistive random access memory (RRAM) stacks within a resistive memory crossbar array. The method includes forming a plurality of conductive lines within an interlayer dielectric (ILD), forming a barrier layer over at least one conductive line of the plurality of conductive lines, the barrier layer directly contacting an entire upper surface of the at least one conductive line, and forming a RRAM stack including a bottom electrode, a high-k dielectric layer, and a top electrode over the barrier layer.

In accordance with another embodiment, a method is provided for protecting resistive random access memory (RRAM) stacks within a resistive memory crossbar array. The method includes forming a barrier layer over at least one conductive line of a plurality of conductive lines, the barrier layer directly contacting an upper surface of the at least one conductive line and forming a RRAM stack over the barrier layer, the RRAM stack including at least three layers.

In accordance with yet another embodiment, a semiconductor device is provided for protecting resistive random access memory (RRAM) stacks within a resistive memory crossbar array. The semiconductor device includes a plurality of conductive lines disposed within an interlayer dielectric (ILD), a barrier layer disposed over at least one conductive line, the barrier layer directly contacting an entire upper surface of the at least one conductive line, and a RRAM stack disposed over the barrier layer, the RRAM stack including a bottom electrode, a high-k dielectric layer, and a top electrode.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

DETAILED DESCRIPTION

Embodiments in accordance with the present invention provide methods and devices for constructing resistive random access memory (RRAM) devices. The RRAMs can be employed for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing a connection weight in the form of device resistance. Multiple pre-neurons and post-neurons can be connected through a crossbar array of RRAMs, which can be configured as a fully-connected neural network. Large scale integration of large RRAM arrays with complementary metal oxide semiconductor (CMOS) circuits can enable scaling of RRAM devices down to 10 nm and beyond for neuromorphic computing as well as high-density and high-speed non-volatile memory applications.

Embodiments in accordance with the present invention provide methods and devices for constructing a crossbar array structure including a self-aligned barrier layer on metal lines, the barrier layer selectively grown on the RRAM cross-bar array area, thus leaving the periphery area unaffected, and enabling the coexistence of high electrode conductivity and a small active area. This maintains the electrode cross section area as large as possible to maximize conductivity and makes the contact area small to miniaturize the active device area.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
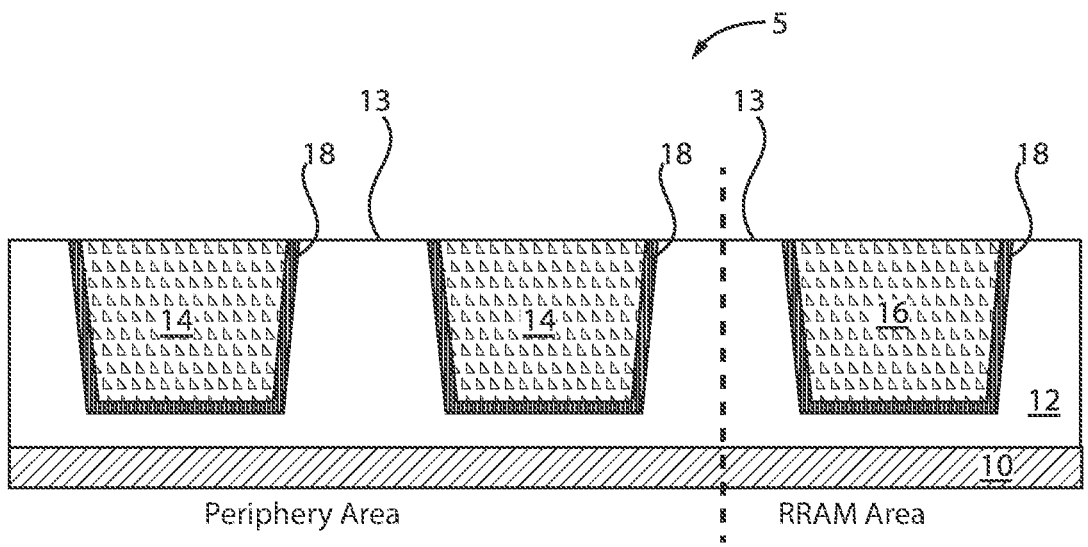
FIG. 1 is a cross-sectional view of a semiconductor structure including a plurality of conductive lines formed within a dielectric layer, in accordance with an embodiment of the present invention.

FIG. 1 is a cross-sectional view of a semiconductor structure including a plurality of conductive lines formed within a dielectric layer, in accordance with an embodiment of the present invention.

A semiconductor structure 5 includes a plurality of conductive lines 14, 16 formed within trenches of an inter-layer dielectric (ILD) 12. The ILD can be formed over a substrate 10. A conductive fill material or liner 18 can be formed or deposited around each of the trenches. In one example, the liner can be a tantalum nitride (TaN) liner 18 or in the alternative a tantalum (Ta) liner 18. In one example embodiment, the conductive fill material 18 can be deposited, for example, by electroplating, electroless plating, chemical vapor deposition (CVD), atomic layer deposition (ALD) and/or physical vapor deposition (PVD). The top surface 13 of the ILD 12 is flush with the top surface of the conductive lines 14, 16.

The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The ILD 12 can include any materials known in the art, such as, for example, porous silicates, carbon doped oxides, silicon dioxides, silicon nitrides, silicon oxynitrides, or other dielectric materials. The ILD 12 can be formed using any method known in the art, such as, for example, chemical vapor deposition, plasma enhanced chemical vapor deposition, atomic layer deposition, or physical vapor deposition. The ILD 12 can have a thickness ranging from about 25 nm to about 200 nm.

The dielectric material of layer 12 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The metal lines 14, 16 can be formed in the openings or trenches formed in the ILD 12. The metal lines 14, 16 can be any conductive materials known in the art, such as, for example, copper (Cu), aluminum (Al), or tungsten (W). The metal lines 14, 16 can be fabricated using any technique known in the art, such as, for example, a single or dual damascene technique. In an embodiment, not illustrated, the metal lines 14, 16 can be copper (Cu) and can include a metal liner, where a metal liner can be metals, such as, for example, tantalum nitride and tantalum (TaN/Ta), titanium, titanium nitride, cobalt, ruthenium, and manganese.

Figure 2:
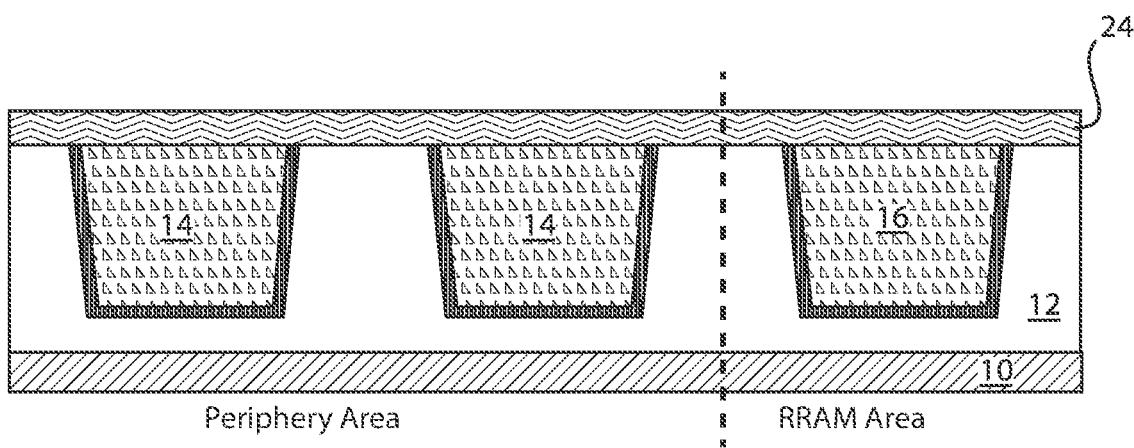
FIG. 2 is a cross-sectional view of the semiconductor structure of FIG. 1 where a hardmask is deposited over the conductive lines, in accordance with an embodiment of the present invention.

FIG. 2 is a cross-sectional view of the semiconductor structure of FIG. 1 where a hardmask is deposited over the conductive lines, in accordance with an embodiment of the present invention.

In various example embodiments, a hardmask 24 is deposited.

The hardmask layer 24 can be a nitride, for example, a silicon nitride (SiN), an oxynitride, for example, silicon oxynitride (SiON), or a combination thereof. In a preferred embodiment, the hardmask layer 24 can be silicon nitride (SiN), for example, $Si_3N_4$.

In one or more embodiments, the hardmask layer 24 can have a thickness in the range of about 20 nm to about 100 nm, or in the range of about 35 nm to about 75 nm, or in the range of about 45 nm to about 55 nm, although other thicknesses are contemplated.

Figure 3:
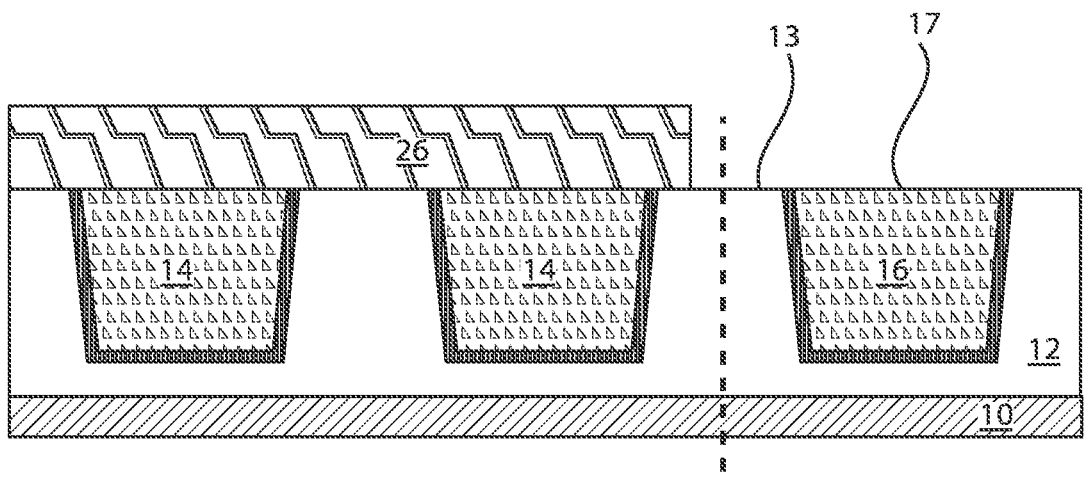
FIG. 3 is a cross-sectional view of the semiconductor structure of FIG. 2 where the hardmask is patterned to expose a top surface of at least one conductive line, in accordance with an embodiment of the present invention.

FIG. 3 is a cross-sectional view of the semiconductor structure of FIG. 2 where the hardmask is patterned to expose a top surface of at least one conductive line, in accordance with an embodiment of the present invention.

In various example embodiments, the hardmask 24 is patterned to expose a top surface 17 of the conductive line 16. Additionally, a top surface 13 of the ILD 12 is exposed. The remaining hardmask over conductive lines 14 is designated as 26.

Figure 4:
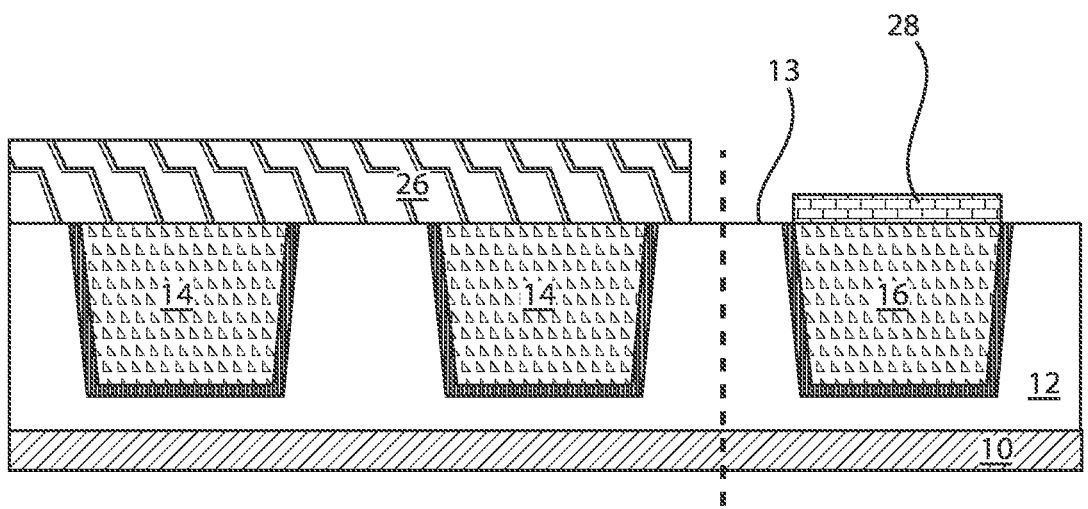
FIG. 4 is a cross-sectional view of the semiconductor structure of FIG. 3 where a barrier layer is formed over and in direct contact with the exposed conductive line, in accordance with an embodiment of the present invention.

FIG. 4 is a cross-sectional view of the semiconductor structure of FIG. 3 where a barrier layer is formed over and in direct contact with the exposed conductive line, in accordance with an embodiment of the present invention.

In various example embodiments, a barrier layer 28 is formed over the exposed conductive line 16. The barrier layer 28 can be, e.g. a tantalum nitride (TaN) layer. The barrier layer 28 extends over an entire upper surface of the conductive line 16. The barrier layer 28 directly contacts the entire upper surface of the conductive line 16.

The barrier layer 28 exists on metal lines in RRAM cross-bar array regions only and above the interlayer dielectric of the underlying level. Moreover, selective growth of barrier layer 28 (e.g., TaN, TiN, W, Co, Ru) can be performed and a vertical resistance of the barrier layers can be sufficiently low compared to a low resistance state of the RRAM (~kOhm).

Figure 5:
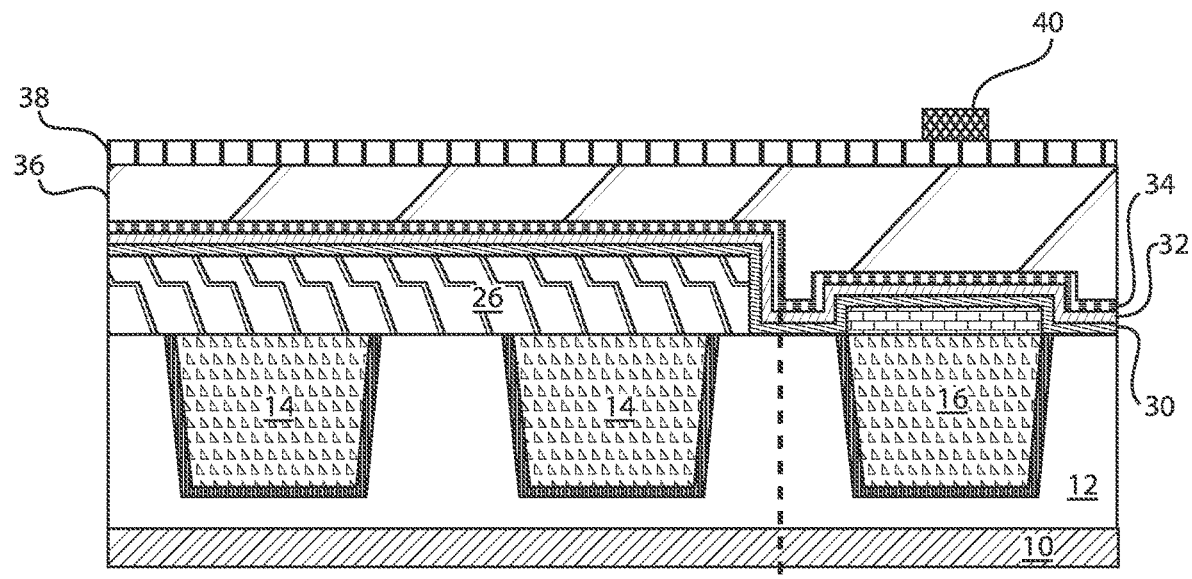
FIG. 5 is a cross-sectional view of the semiconductor structure of FIG. 4 where a bottom electrode, a high-k dielectric layer, a top electrode, an organic planarization layer (OPL), an anti-reflective coating (ARC) layer, and a photoresist layer are formed over the conductive lines, in accordance with an embodiment of the present invention.

FIG. 5 is a cross-sectional view of the semiconductor structure of FIG. 4 where a bottom electrode, a high-k dielectric layer, a top electrode, an organic planarization layer (OPL), an anti-reflective coating (ARC) layer, and a photoresist layer are formed over the conductive lines, in accordance with an embodiment of the present invention.

In various embodiments, a RRAM stack is formed. The RRAM stacks includes a first layer 30, a second layer 32, and a third layer 34. The first layer 30 can be, e.g., a TiN layer, the second layer 32 can be, e.g., a high-k dielectric layer, and the third layer 34 can be, e.g., a TiN layer. The second layer 32 can be any type of high-k dielectric layer, such as, but not limited to, $HfO_2$, HfSiO, HfSiON, HfZrO, $Ta_2O_5$, $TiO_2$, $La_2O_3$, $Y_2O_3$, $Al_2O_3$, and mixtures thereof. The first and third layers 30 can be referred to as metal layers formed of a thermally stable metal, such as TiN, TaN, TaC, TiAlN, TaAlN, or their derivatives. The first layer 30 can be referred to as a bottom electrode and the third layer 34 can be referred to as a top electrode.

In various embodiments, a lithographic stack can be formed over the RRAM stack. The lithographic stack can include an organic planarization layer (OPL) or organic dielectric layer (ODL) 36 can then be formed over the RRAM stack. Additionally, an anti-reflective coating (ARC) layer 38 and a photoresist layer 40 can be formed over portions of the OPL 36. The thickness of the OPL 36 can be in a range from about 50 nm to about 300 nm. In one example, the thickness of the OPL 36 is about 200 nm.

The bottom and top electrodes 30, 34 can include a conductive material, such as Cu, Al, Ag, Au, Pt, W, etc. In some embodiments, the bottom and top electrodes 30, 34 can include nitrides such as TiN, TaN, Ta or Ru.

The OPL layer 36 and the ARC layer 38 can be employed as a lithographic stack to pattern the underlying layers. The OPL layer 36 is formed at a predetermined thickness to provide reflectivity and topography control during etching of the hard mask layers below. The OPL layer 36 can include an organic material, such as a polymer.

The layer 38 is an ARC layer which minimizes the light reflection during lithography for a lithography stack. The ARC layer 38 can include silicon, for example, a silicon anti-reflective layer (SiARC). The thickness of the ARC layer 38 can be in range from about 10 nm to about 100 nm.

The anti-reflective film layer 38 can be an antireflective layer for suppressing unintended light reflection during photolithography. Exemplary materials for an antireflective layer include, but are not limited to, metal silicon nitrides, or a polymer film. The anti-reflective layer can be formed, depending on materials, for example, using sputter deposition, chemical vapor deposition, or spin coating.

A photolithography process usually includes applying a layer of photoresist material 40 (e.g., a material that will react when exposed to light), and then selectively exposing portions of the photoresist 40 to light or other ionizing radiation (e.g., ultraviolet, electron beams, X-rays, etc.), thereby changing the solubility of portions of the material. The resist 40 is then developed by washing the resist with a developer solution, such as, e.g., tetramethylammonium hydroxide (TMAH), thereby removing non-irradiated (in a negative resist) or irradiated (in a positive resist) portions of the resist layer.

Figure 6:
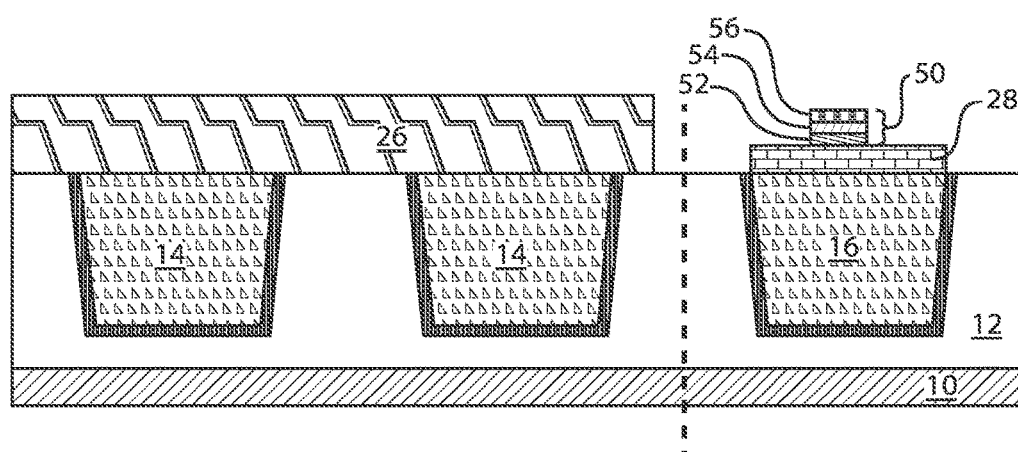
FIG. 6 is a cross-sectional view of the semiconductor structure of FIG. 5 where a resistive random access memory (RRAM) stack is formed by etching the OPL, the ARC layer, and the photoresist, as well as portions of the bottom electrode, the high-k dielectric layer, and the top electrode, in accordance with an embodiment of the present invention.

FIG. 6 is a cross-sectional view of the semiconductor structure of FIG. 5 where a resistive random access memory (RRAM) stack is formed, in accordance with an embodiment of the present invention.

In various embodiments, the OPL 36, the ARC layer 38, and the photoresist 40 are etched such that hardmask 26 remains over conductive lines 14. Additionally, the photoresist 40 causes a RRAM stack 50 to be formed over the barrier layer 28, which in turn is formed over conductive line 16.

The RRAM stack 50 includes a first layer 52, a second layer 54, and a third layer 56. As noted above, the first layer 52 can be, e.g., a TiN layer, the second layer 54 can be, e.g., a high-k dielectric layer, and the third layer 56 can be, e.g., a TiN layer. The etching can be, e.g., a reactive ion etch (RIE).

Therefore, the RRAM stack 50 includes the RRAM bottom electrode, which can be, e.g., TiN, TaN, or W, the RRAM metal oxide, which can be, e.g., HfOx, TaOx, TiOx, AlOx, and the RRAM top electrode, which can be, e.g., Ti, TiN, and combination thereof. The RRAM cross-bar array has a periphery circuit built between the metal lines. A barrier layer 28 exists on metal lines in RRAM cross-bar array regions only and above the interlayer dielectric of the underlying level. Moreover, selective growth of barrier layers 28 (e.g., TaN, TiN, W, Co, Ru) can be performed and a vertical resistance of the barrier layers can be sufficiently low compared to a low resistance state of the RRAM (~kOhm).

Figure 7:
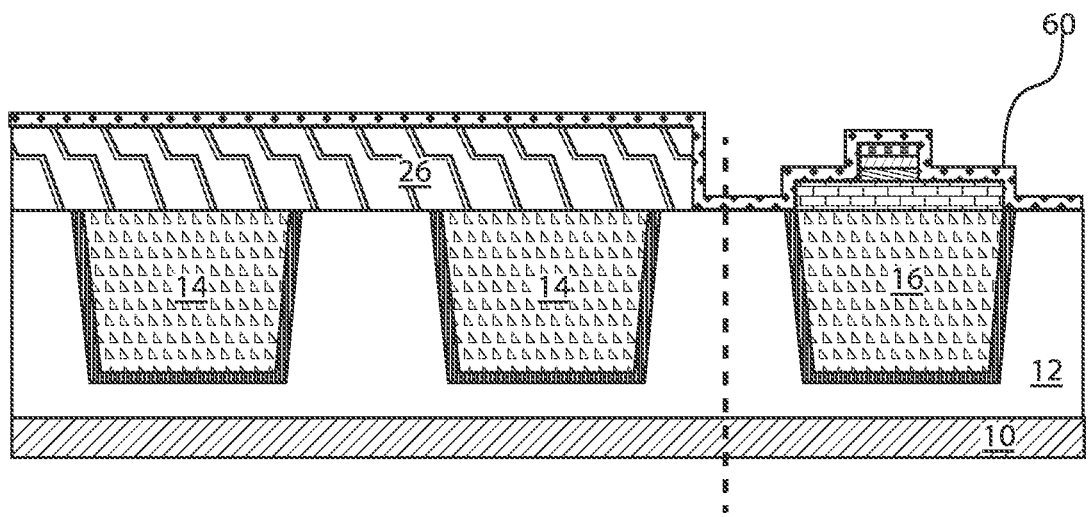
FIG. 7 is a cross-sectional view of the semiconductor structure of FIG. 6 where the RRAM stack is encapsulated by a dielectric material, in accordance with an embodiment of the present invention.

FIG. 7 is a cross-sectional view of the semiconductor structure of FIG. 6 where the RRAM stack is encapsulated by a dielectric material, in accordance with an embodiment of the present invention.

In various embodiments, a SiN encapsulation 60 takes place. The SiN layer 60 encapsulates the RRAM stack 50.

Figure 8:
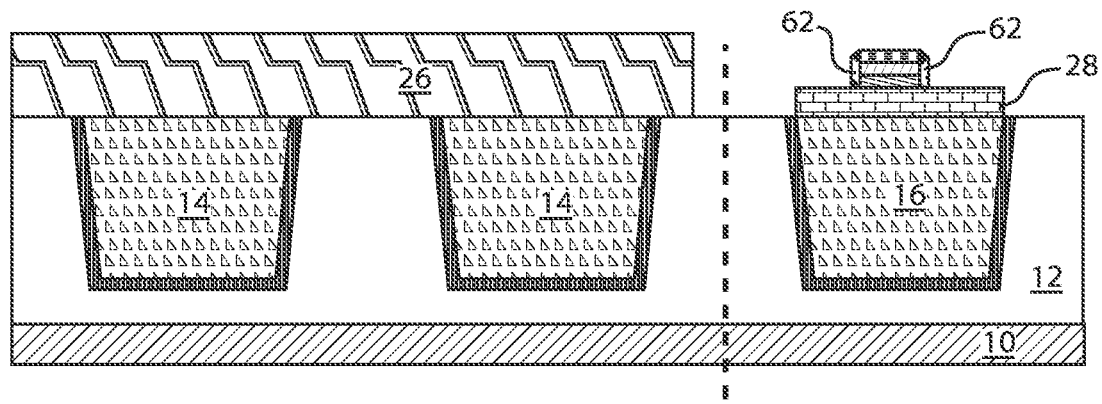
FIG. 8 is a cross-sectional view of the semiconductor structure of FIG. 7 where the dielectric material is etched to form outer spacers adjacent the RRAM stack, in accordance with an embodiment of the present invention.

FIG. 8 is a cross-sectional view of the semiconductor structure of FIG. 7 where the dielectric material is etched to form outer spacers adjacent the RRAM stack, in accordance with an embodiment of the present invention.

In various embodiments, the SiN layer 60 is etched to form outer spacers 62 adjacent the RRAM stack 50. The SiN layer 60 can be selectively etched by, e.g., RIE. The etch also results in the exposure of the top surface of the top electrode 56 of the RRAM stack 50.

Figure 9:
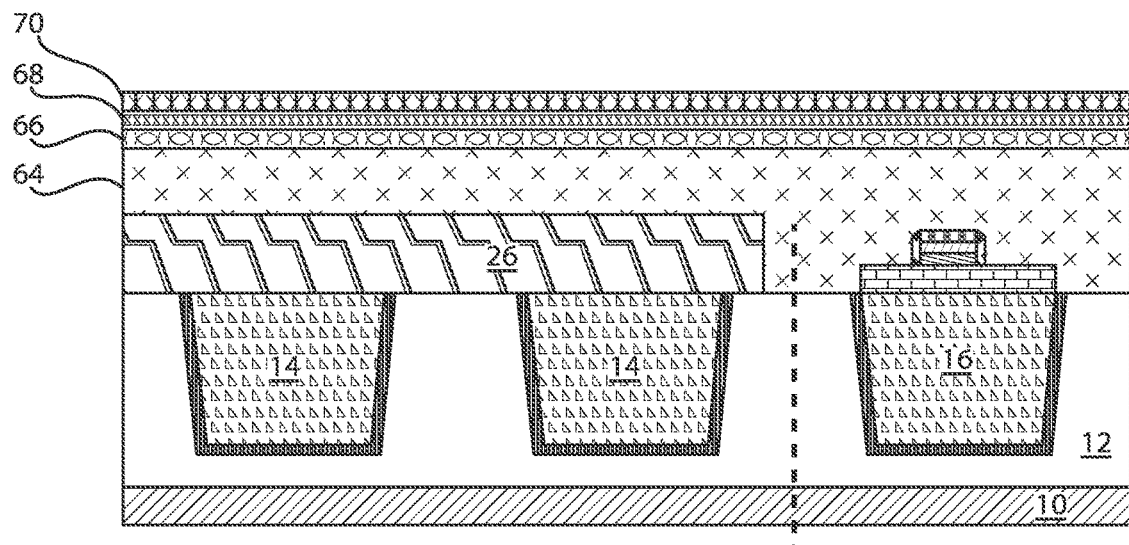
FIG. 9 is a cross-sectional view of the semiconductor structure of FIG. 8 where an interlayer dielectric (ILD) and a plurality of sacrificial layers are deposited, in accordance with an embodiment of the present invention.

FIG. 9 is a cross-sectional view of the semiconductor structure of FIG. 8 where an interlayer dielectric (ILD) and a plurality of sacrificial layers are deposited, in accordance with an embodiment of the present invention.

In various embodiments, a low-k dielectric layer 64 is deposited. A low-k dielectric material as used in the low-k dielectric layer 64 can have a dielectric constant that is less than 4.0, e.g., 3.9. In one embodiment, the low-k material layer 64 can have a dielectric constant ranging from about 1.0 to about 3.5. In another embodiment, the low-k material layer 64 can have a dielectric constant ranging from about 1.75 to about 3.2.

One example of a material suitable for the low-k materials for the low-k dielectric layer 64 can include silicon oxycarbonitride (SiOCN). Other low-k materials that can also be used for the low-k dielectric layer 64 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 64 can be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed. In some embodiments, the low-k dielectric layer 64 can have a thickness ranging from about 5 nm to about 30 nm. In another embodiment, the low-k dielectric layer 64 can have a thickness ranging from about 7 nm to about 15 nm.

Subsequently, a plurality of sacrificial layers can be deposited. In one example, a first sacrificial layer 66, a second sacrificial layer 68, and a third sacrificial layer 70 are deposited over the low-k dielectric layer 64. In one example, the first sacrificial layer 66 can be a SiN layer, the second sacrificial layer 68 can be a TiN hardmask, and the third sacrificial layer 70 can be a TEOS hard mask (tetraethyl orthosilicate, $Si(OC_2H_5)_4$).

Figure 10:
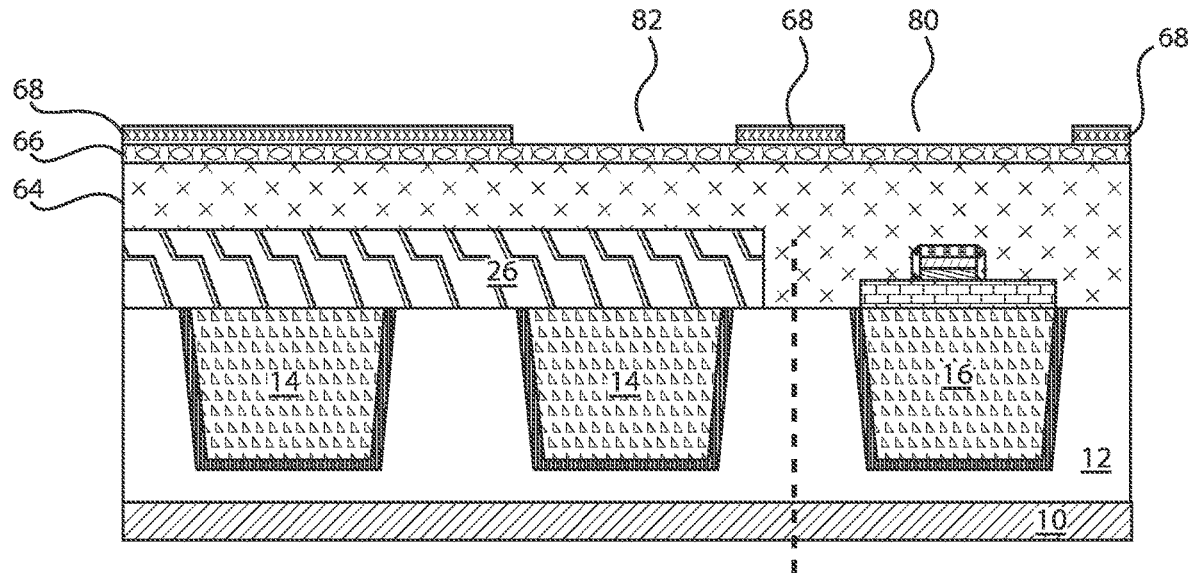
FIG. 10 is a cross-sectional view of the semiconductor structure of FIG. 9 where the sacrificial layers are etched to form openings directly over the plurality of conductive lines, in accordance with an embodiment of the present invention.

FIG. 10 is a cross-sectional view of the semiconductor structure of FIG. 9 where the sacrificial layers are etched to form openings directly over the plurality of conductive lines, in accordance with an embodiment of the present invention.

In various embodiments, the second and third sacrificial layers 68, 70 can be etched by, e.g., RIE, to create a first opening or recess 80 over the conductive line 16 and to create a second opening or recess 82 over the conductive line 14. The first sacrificial layer 66 is not removed. The top surface of the first sacrificial layer 66 remains intact in the first and second openings 80, 82. The third sacrificial layer 70 is completely removed such that a top surface of the second sacrificial layer 78 is exposed in areas where the openings 80, 82 do not occur.

Figure 11:
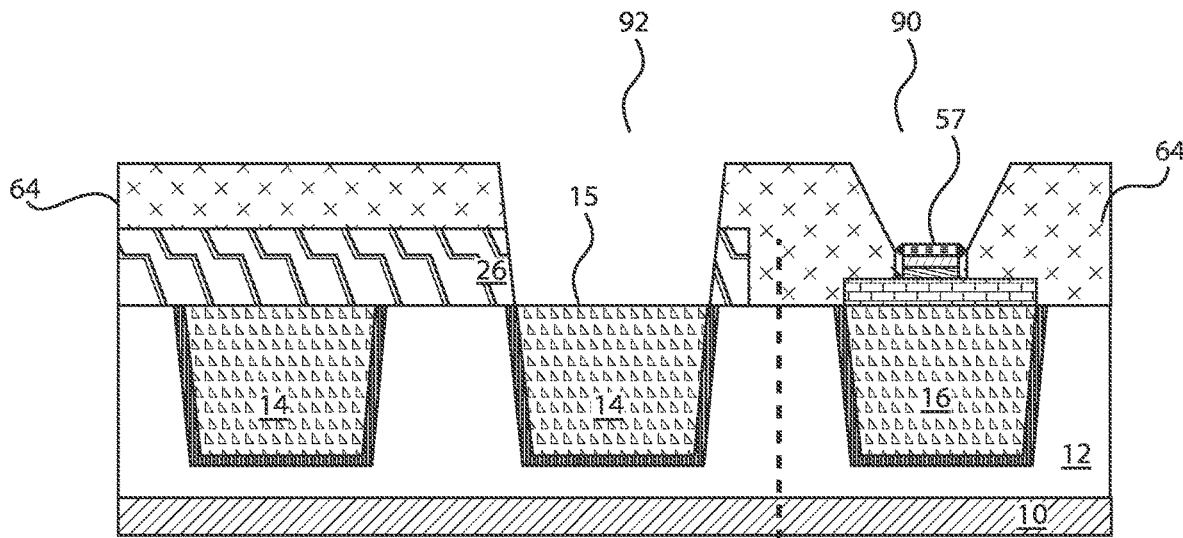
FIG. 11 is a cross-sectional view of the semiconductor structure of FIG. 10 where the RRAM stack formed over the conductive line is exposed by creating a via, and then the remaining sacrificial layers are removed, in accordance with an embodiment of the present invention.

FIG. 11 is a cross-sectional view of the semiconductor structure of FIG. 10 where the RRAM stack formed over the conductive line is exposed, in accordance with an embodiment of the present invention.

In various embodiments, vias are formed. A first via 90 extends to a top surface 57 of the top electrode 56 of the RRAM stack 50 and a second via 92 extends to a top surface 15 of the conductive line 14. Additionally, outer spacers 62 are maintained adjacent the RRAM stack 50. Only the top surface of the outer spacers 62 is exposed. Moreover, in various embodiments, the first and second sacrificial layers 68, 70 are completely removed to expose a top surface of the low-k dielectric layer 64.

Thus, formation of a selective barrier layer 28 between the metal lines 14, 16 and the bottom electrode 52 of the RRAM 50 enables high performance resistive switching device elements. Stated differently, the present invention discloses selective growth of barrier layers 28 on metal vias in the active device area and the RRAM pillars are defined separately over the metal line. Thus, the barrier layer 28 is the same size as the metal via and not the RRAM pillar. The barrier layer 28 is selectively grown on the metal via in a self-aligned manner. In other words, the barrier layer 28 is added in a self-aligned manner without affecting the line resistance in the periphery area. This invention takes advantage of selective deposition of a barrier layer (e.g., TaN, TiN, W, Co, Ru) on the Cu surface in the RRAM device area. The Cu lines in the periphery area will not get the barrier layer 28, thus leaving unique structural features. The barrier layer 28 protects the RRAM stacks from Cu.

The invention provides the following benefits: (1) self-aligned barrier layer on metal lines with no additional CMP and RIE steps, and (2) the barrier layer can be selectively grown on the RRAM cross-bar array area. Thus, the periphery area remains unaffected.

Figure 12:
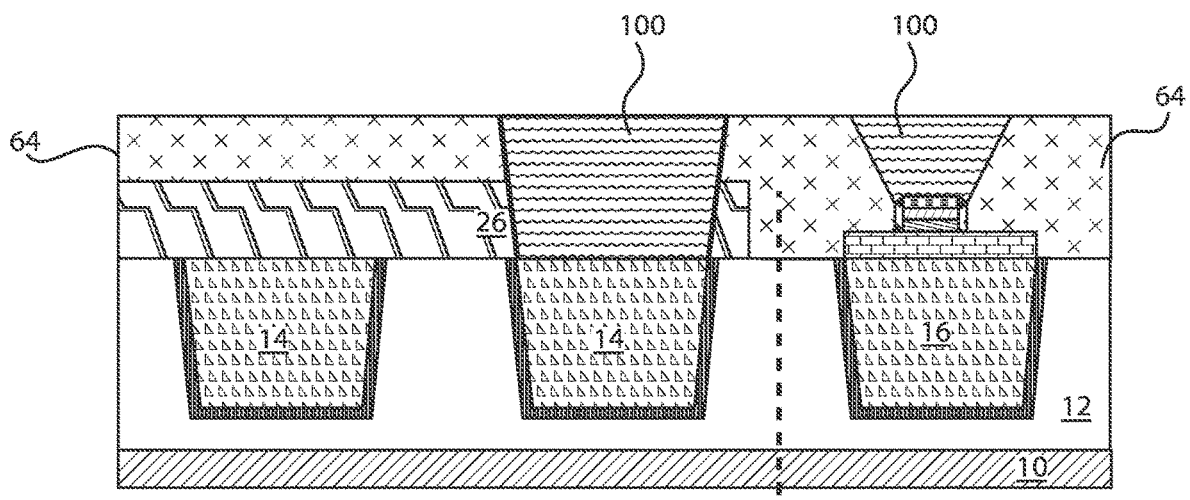
FIG. 12 is a cross-sectional view of the semiconductor structure of FIG. 11 where a metal fill takes place, the metal fill being planarized, in accordance with an embodiment of the present invention.

FIG. 12 is a cross-sectional view of the semiconductor structure of FIG. 11 where a metal fill takes place, the metal fill being planarized, in accordance with an embodiment of the present invention.

In various example embodiments, a conductive material 100 can be deposited. The metallization can be a single damascene metallization. Thus, only single damascene metallization is needed for the trench, thus enabling dynamic reflow or other fill techniques that are sensitive to pattern and profile needs. The conductive material 100 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the height of the conductive material 100 can be reduced by chemical-mechanical polishing (CMP) and/or etching. Therefore, the planarization process can be provided by CMP. Other planarization process can include grinding and polishing.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

In conclusion, the exemplary embodiments of the present invention employ selective deposition of a barrier layer (e.g., TaN, TiN, W, Co, Ru) on the Cu surface in the RRAM device area. The Cu lines in the periphery area will not get the barrier layer, thus leaving detectable unique structural features. The barrier layer protects the RRAM stacks from Cu. In other words, the barrier layer is added in a selective manner and in a self-aligned manner, where the metal lines (e.g., Cu lines) in the periphery area do not get the barrier layer and, thus, do not affect the line resistance in the periphery area.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for employing selective barrier layer growth (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure for protecting resistive random access memory (RRAM) stacks within a resistive memory crossbar array, the semiconductor structure comprising:
   a plurality of conductive lines disposed within an interlayer dielectric (ILD);
   a refractory metal barrier layer disposed over at least one conductive line, the refractory metal barrier layer directly contacting an entire upper surface of the at least one conductive line; and
   a RRAM stack disposed in direct contact with the refractory metal barrier layer, the RRAM stack including a bottom electrode, a high-k dielectric layer, and a top electrode,
   wherein upper surfaces and sidewalls of the refractory metal barrier layer directly contact a low-k dielectric material.

2. The semiconductor structure of claim 1, wherein the refractory metal barrier layer includes tantalum nitride (TaN).

3. The semiconductor structure of claim 1, wherein the bottom electrode includes titanium nitride (TiN).

4. The semiconductor structure of claim 1, wherein the top electrode includes titanium nitride (TiN).

5. The semiconductor structure of claim 1, wherein spacers are formed adjacent the RRAM stack.

6. The semiconductor structure of claim 5, wherein the spacers directly contact a top surface of the refractory metal barrier layer.

7. The semiconductor structure of claim 6, wherein the spacers include silicon nitride (SiN).

8. The semiconductor structure of claim 7, wherein a via is formed over the RRAM stack and is filled with a conductive material.

9. The semiconductor structure of claim 8, wherein the conductive material directly contacts an entire upper surface of the RRAM stack.

10. The semiconductor structure of claim 8, wherein the conductive material directly contacts an upper surface of the spacers.

11. A semiconductor structure for protecting resistive random access memory (RRAM) stacks within a resistive memory crossbar array, the semiconductor structure comprising:
    a plurality of conductive lines disposed within an interlayer dielectric (ILD);
    a refractory metal barrier layer disposed over at least one conductive line; and
    a RRAM stack disposed in direct contact with the refractory metal barrier layer, the RRAM stack including a bottom electrode, a high-k dielectric layer, and a top electrode,
    wherein upper surfaces and sidewalls of the refractory metal barrier layer directly contact a low-k dielectric material.

12. The semiconductor structure of claim 11, wherein the refractory metal barrier layer directly contacts an entire upper surface of the at least one conductive line.

13. The semiconductor structure of claim 11, wherein the bottom electrode includes titanium nitride (TiN).

14. The semiconductor structure of claim 11, wherein the top electrode includes titanium nitride (TiN).

15. The semiconductor structure of claim 11, wherein spacers are formed adjacent the RRAM stack.

16. The semiconductor structure of claim 15, wherein the spacers directly contact a top surface of the refractory metal barrier layer.

17. The semiconductor structure of claim 16, wherein the spacers include silicon nitride (SiN).

18. The semiconductor structure of claim 17, wherein a via is formed over the RRAM stack and is filled with a conductive material.

19. The semiconductor structure of claim 18, wherein the conductive material directly contacts an entire upper surface of the RRAM stack.

20. The semiconductor structure of claim 18, wherein the conductive material directly contacts an upper surface of the spacers.

* * * * *